United States Patent
Goda et al.

(10) Patent No.: US 9,550,663 B2
(45) Date of Patent: Jan. 24, 2017

(54) MEMS DEVICE

(71) Applicant: Panasonic Intellectual Property Management Co., Ltd., Osaka (JP)

(72) Inventors: Kazuo Goda, Osaka (JP); Takumi Taura, Kyoto (JP); Shinichi Kishimoto, Osaka (JP); Hideki Ueda, Fukui (JP); Takeshi Mori, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/764,572

(22) PCT Filed: Feb. 3, 2014

(86) PCT No.: PCT/JP2014/000547
§ 371 (c)(1),
(2) Date: Jul. 30, 2015

(87) PCT Pub. No.: WO2014/122910
PCT Pub. Date: Aug. 14, 2014

(65) Prior Publication Data
US 2015/0368089 A1    Dec. 24, 2015

(30) Foreign Application Priority Data

Feb. 6, 2013 (JP) ................. 2013-020990

(51) Int. Cl.
*H01L 29/84* (2006.01)
*B81B 3/00* (2006.01)
(Continued)

(52) U.S. Cl.
CPC ........... *B81B 3/0008* (2013.01); *G01P 15/125* (2013.01); *B81B 2201/0235* (2013.01); *G01P 2015/0834* (2013.01); *H01L 29/84* (2013.01)

(58) Field of Classification Search
CPC ..................... B81B 3/0008; B81B 2201/0235; G01P 15/125; G01P 2015/0834; H01L 29/84
See application file for complete search history.

(56) References Cited

U.S. PATENT DOCUMENTS 9,051,170 B2 * 6/2015 Huang ............... G01R 33/0286
2010/0307246 A1   12/2010 Fujii et al.

FOREIGN PATENT DOCUMENTS

JP    2005-265565    9/2005
JP    2008-070284    3/2008
(Continued)

OTHER PUBLICATIONS

International Search Report of PCT application No. PCT/JP2014/000547 dated Apr. 22, 2014.

*Primary Examiner* — Fernando L Toledo
*Assistant Examiner* — Neil Prasad
(74) *Attorney, Agent, or Firm* — McDermott Will & Emery LLP

(57) ABSTRACT

A MEMS device includes a movable section, a frame, a beam, and an electrode substrate. The frame surrounds a surrounding of the movable section. The beam extends from at least a part of the frame, and is connected to the movable section. The electrode substrate includes a fixed electrode, an extended electrode, and a substrate section. The fixed electrode is formed on the electrode substrate in at least a part of a region facing a swing section. The extended electrode is connected to the fixed electrode, and is formed on the electrode substrate in at least a part of a region facing the shaft.

12 Claims, 15 Drawing Sheets

(51) Int. Cl.
*G01P 15/125* (2006.01)
*G01P 15/08* (2006.01)

(56) References Cited

FOREIGN PATENT DOCUMENTS

| | | |
|---|---|---|
| JP | 2010-281789 | 12/2010 |
| JP | 2011-017693 | 1/2011 |
| JP | 2011-066429 | 3/2011 |
| JP | 2012-220376 | 11/2012 |

\* cited by examiner

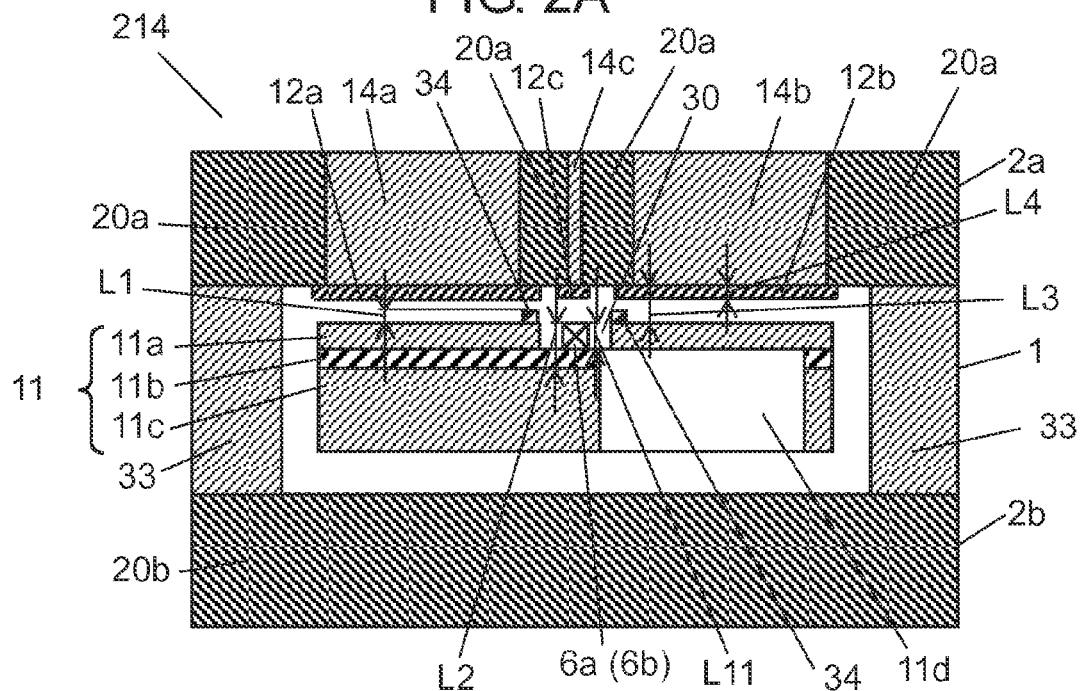
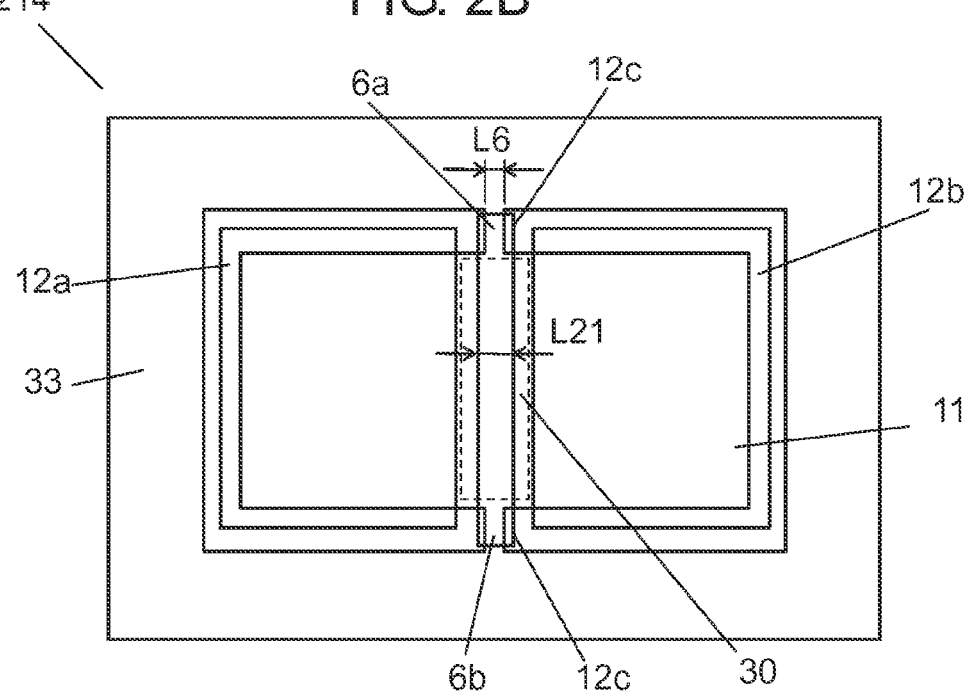

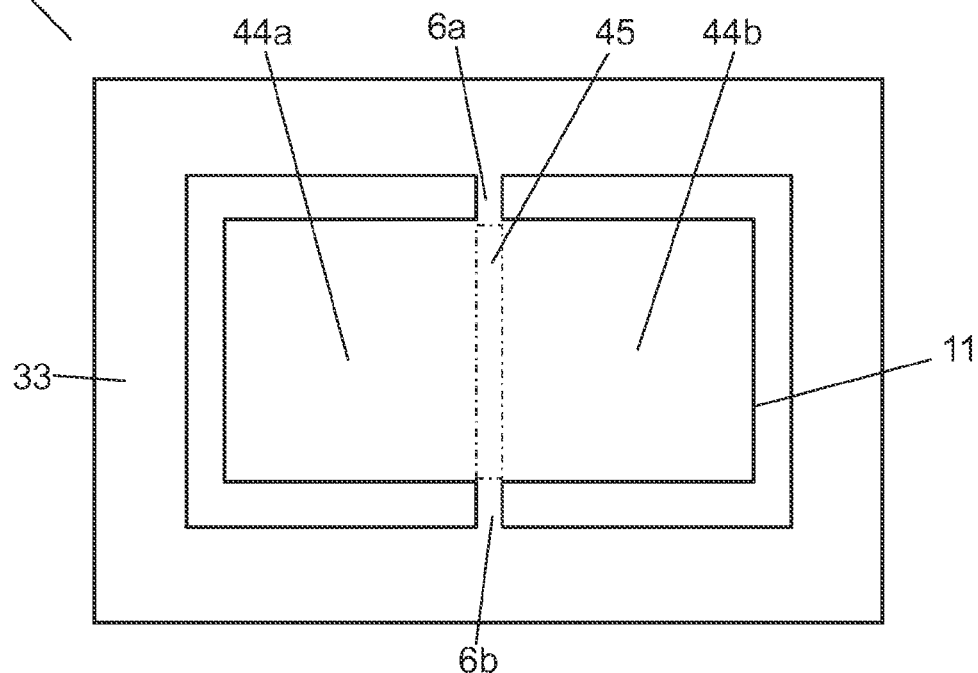
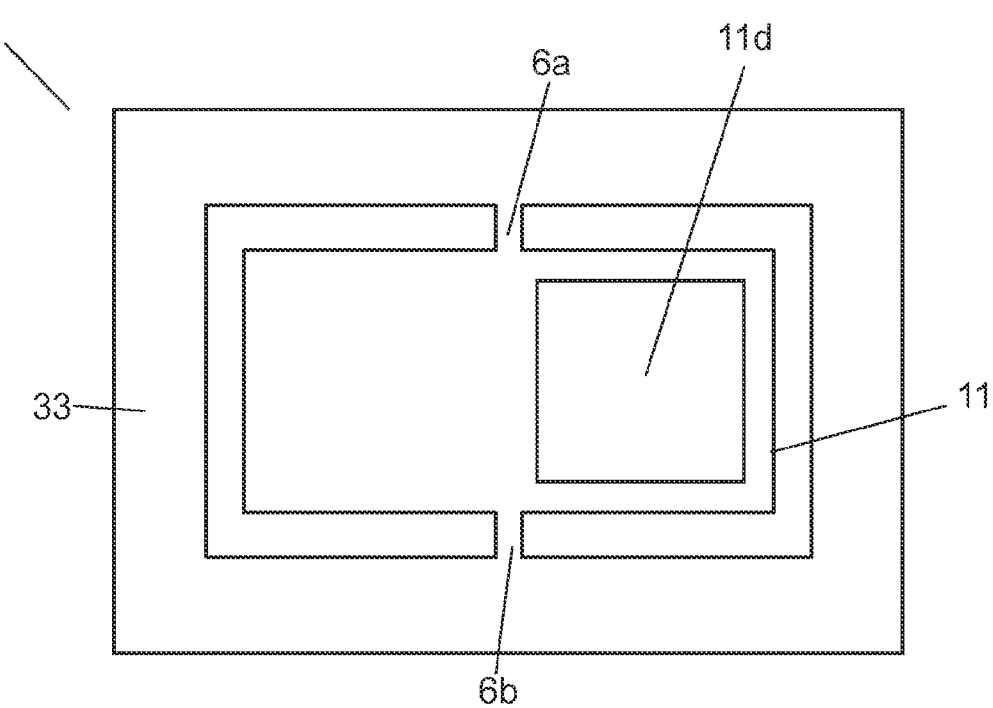

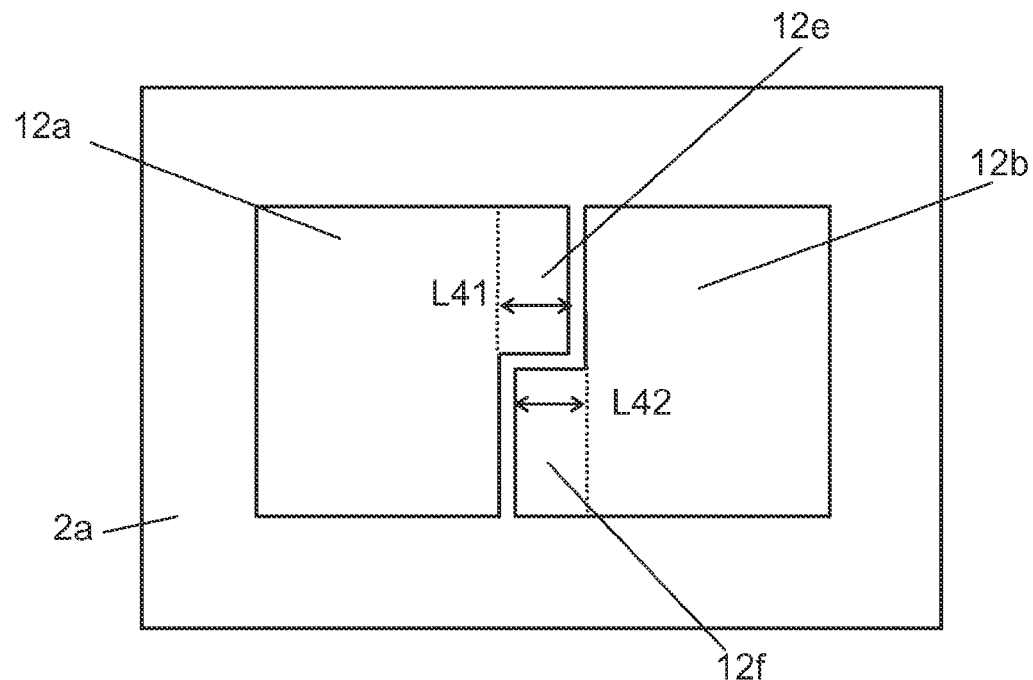
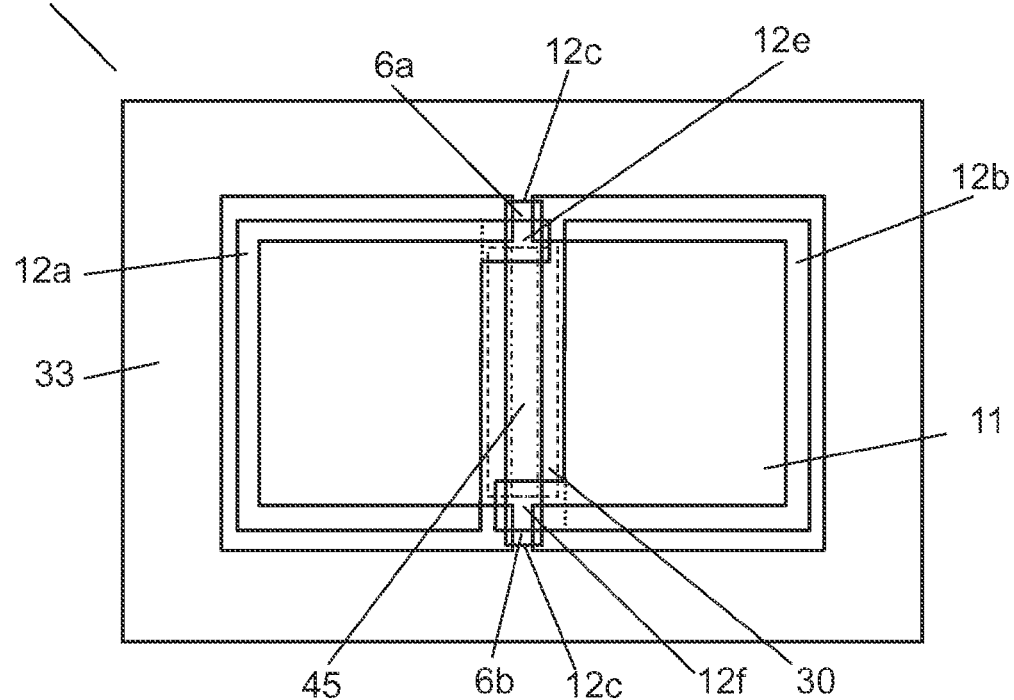

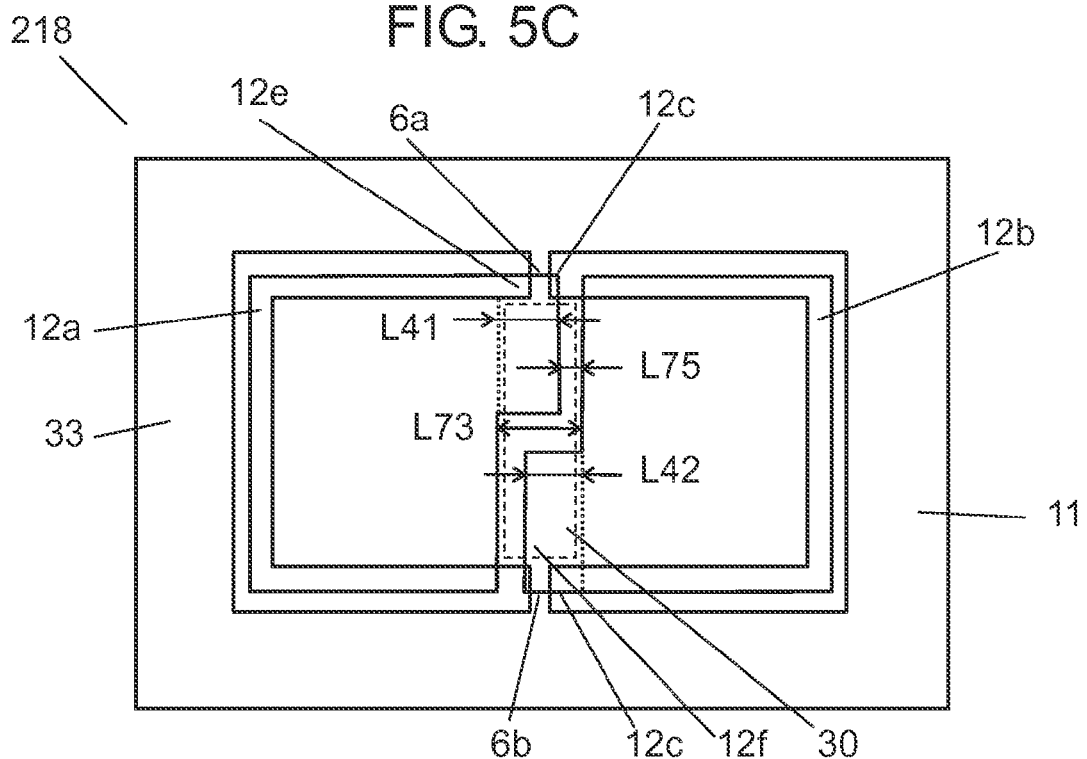

MEMS DEVICE

CROSS-REFERENCE TO RELATED APPLICATIONS

This application is a U.S. national stage application of the PCT International Application No. PCT/JP2014/000547 filed on Feb. 3, 2014, which claims the benefit of foreign priority of Japanese patent application 2013-020990 filed on Feb. 6, 2013, the contents all of which are incorporated herein by reference.

TECHNICAL FIELD

The present technical field relates to a MEMS (Micro-Electro-Mechanical Systems) device.

BACKGROUND ART

FIG. 7 is a perspective view showing an internal structure of package 1300 incorporating a conventional MEMS device. FIG. 7 shows a state in which a lid of package 1300 is opened. Package 1300 is mounted on substrate 1500. Sensor chip 1100 and integrated circuit 1200 such as an ASIC (Application Specific Integrated Circuit) are mounted on package 1300. The MEMS device is accommodated in sensor chip 1100. Integrated circuit 1200 carries out various operations based on an output from sensor chip 1100. Terminals 1400 are extracted from package 1300 and connected to substrate 1500.

Hereinafter, a capacitance type acceleration sensor as a MEMS device is described. FIG. 8A is a vertical sectional view of conventional acceleration sensor 210. FIG. 8B is a horizontal sectional schematic view of conventional acceleration sensor 210. FIG. 8C is a top view of movable body 101 of conventional acceleration sensor 210. FIG. 8D is a bottom view of movable body 101 of conventional acceleration sensor 210.

Capacitance type acceleration sensor 210 includes movable body 101 and electrode substrates 122a and 122b.

Movable body 101 includes movable section 111, frame 133, and beams 16a and 16b. Frame 133 is an outer frame surrounding movable section 111. Movable section 111 is supported by frame 133 around beams 16a and 16b as a rotary shaft.

As shown in FIG. 8C, movable section 111 includes shaft 145 that is an extension portion of beams 16a and 16b, and swing sections 144a and 144b that are places other than shaft 145 of movable section 111. Swing section 144a is a cube, and swing section 144b is a cube having opening 111d at an opposite side to a surface facing fixed electrode 112b.

Frame 133 is formed of silicon (Si). Movable section 111 is formed of SOI (Silicon on Insulator). Specifically, movable section 111 is formed by sandwiching oxide film 111b such as $SiO_2$ between Si layer 111a and Si layer 111c.

Electrode substrates 122a and 122b are disposed to both surfaces of movable body 101. A periphery of movable body 101 is bonded to peripheries of electrode substrates 122a and 122b by anodic bonding. Electrode substrate 122a includes substrate section 120a, lead electrodes 114a and 114b, and fixed electrodes 112a and 112b. Substrate section 120a is formed of glass. Lead electrodes 114a and 114b are formed of Si. Electrode substrate 122b includes substrate section 120b formed of glass. Fixed electrodes 112a and 112b are a metal thin film formed by, for example, sputtering. Fixed electrode 112a is formed on electrode substrate 122a in at least a part of a region facing swing section 144a.

Fixed electrode 112b is formed on electrode substrate 122a in at least a part of a region facing swing section 144b. Lead electrodes 114a and 114b are embedded in substrate section 120a, and thereby potential of fixed electrodes 112a and 112b can be led to the upper surface of electrode substrate 122a.

When movable section 111 swings by acceleration, capacitance between fixed electrode 112a and movable section 111 as well as capacitance between fixed electrode 112b and movable section 111 are changed. For example, capacitance C can be calculated from $C=\in S/d$ where $\in$ is a dielectric constant of a substance, S is an area of electrodes sandwiching the substance, and d is a gap between the electrodes. Since capacitance C is changed when movable section 111 swings by acceleration, by calculating the differential capacity by integrated circuit 1200, the acceleration can be detected.

That is to say, acceleration sensor 210 detects displacement of movable section 111 from the change in the capacitance between movable section 111 and fixed electrodes 112a and 112b, and then detects acceleration based on the detected displacement.

A plurality of projecting stoppers 134 is formed on movable section 111 at a surface facing fixed electrodes 112a and 112b. Formation of stoppers 134 can suppress damage due to collision of movable section 111 with fixed electrodes 112a and 112b even when large acceleration is applied to movable section 111.

Bonding portions between electrode substrates 122a and 122b and frame 133 are substrate sections 120a and 120b, respectively and are formed of glass. Bonding portions between movable body 101 and electrode substrates 122a and 122b are formed of silicon (Si). Electrode substrates 122a and 122b and movable body 101 are bonded to each other by using anodic bonding. However, during the anodic bonding, depending on an applied voltage, an electrostatic attraction force is generated between glass and Si. With this electrostatic attraction force, a part of movable section 111 may be attracted to electrode substrate 122a side, and bonded thereto.

FIG. 9A is a vertical sectional view of another conventional acceleration sensor 212. FIG. 9B is a horizontal sectional schematic view of the another conventional acceleration sensor 212. Recess 130 is provided to movable section 111 at a region facing a portion interposed between fixed electrode 112a and fixed electrode 112b (hereinafter, referred to as "facing region"). Recess 130 is formed by thinning at least a part of the facing region of movable section 111. By providing recess 130, an electrostatic attraction force can be reduced. When the electrostatic attraction force is made to be smaller than an elastic force, it is possible to suppress bonding of movable section 111 to substrate section 120a.

However, in a small chip, beams 16a and 16b are required to be made extremely thin. As a result, beams 16a and 16b may be deformed due to the electrostatic attraction force generated during anodic bonding, and beams 16a and 16b may be bonded to glass.

In the case where beams 16a and 16b are made extremely thin, when movable body 101 and electrode substrate 122a are bonded to each other by anodic bonding at a voltage about 400V, beams 16a and 16b are attracted to substrate section 120a by the electrostatic attraction force generated at the time of anodic bonding. Accordingly, beams 16a and 16b may be deformed, and beams 16a and 16b may be bonded to substrate section 120a.

That is to say, when movable body 101 and electrode substrate 122a are bonded to each other by anodic bonding, an electrostatic attraction force is generated between glass and Si by the applied voltage. With this electrostatic attraction force, a part of movable section 111 formed of Si may be attracted to glass, and thus bonded to glass. In particular, in a small chip, beams 16a and 16b are being thinned. As a result, beams 16a and 16b may be deformed due to the electrostatic attraction force generated during anodic bonding, and beams 16a and 16b may be bonded to glass. Prior art literature mentioned above includes, for example, PTL 1.

CITATION LIST

Patent Literature

Japanese Patent Application Unexamined Publication No. 2012-220376

SUMMARY OF THE INVENTION

A MEMS device includes a movable section, a frame, a beam, and an electrode substrate. The frame is apart from the movable section and surrounds a surrounding of the movable section. The beam extends from at least a part of the frame, and is connected to the movable section. The electrode substrate includes a fixed electrode, an extended electrode, and a substrate section. The electrode substrate faces the movable section and has a periphery bonded to the periphery of the frame. An extension portion of the beam in the movable section is a shaft, and a place other than the shaft of the movable section is a swing section. The fixed electrode is formed on the electrode substrate in at least a part of a region facing the swing section. The extended electrode is connected to the fixed electrode, and formed on the electrode substrate in at least a part of a region facing the shaft.

BRIEF DESCRIPTION OF THE DRAWINGS

FIG. 2A is a vertical sectional view of an acceleration sensor in accordance with the exemplary embodiment.

FIG. 2B is a horizontal sectional schematic view of the acceleration sensor in accordance with the exemplary embodiment.

FIG. 2C is a top view of a movable body of the acceleration sensor in accordance with the exemplary embodiment.

FIG. 2D is a bottom view of the movable body of the acceleration sensor in accordance with the exemplary embodiment.

FIG. 4C is a bottom schematic view of a fixed electrode and an extended electrode of the yet another acceleration sensor in accordance with the exemplary embodiment.

FIG. 4D is a horizontal sectional schematic view of a further acceleration sensor in accordance with the exemplary embodiment.

FIG. 5C is a schematic view illustrating a configuration of a movable section, fixed electrodes, and extended electrodes of another acceleration sensor in accordance with the exemplary embodiment.

DESCRIPTION OF EMBODIMENTS

Figure 1:
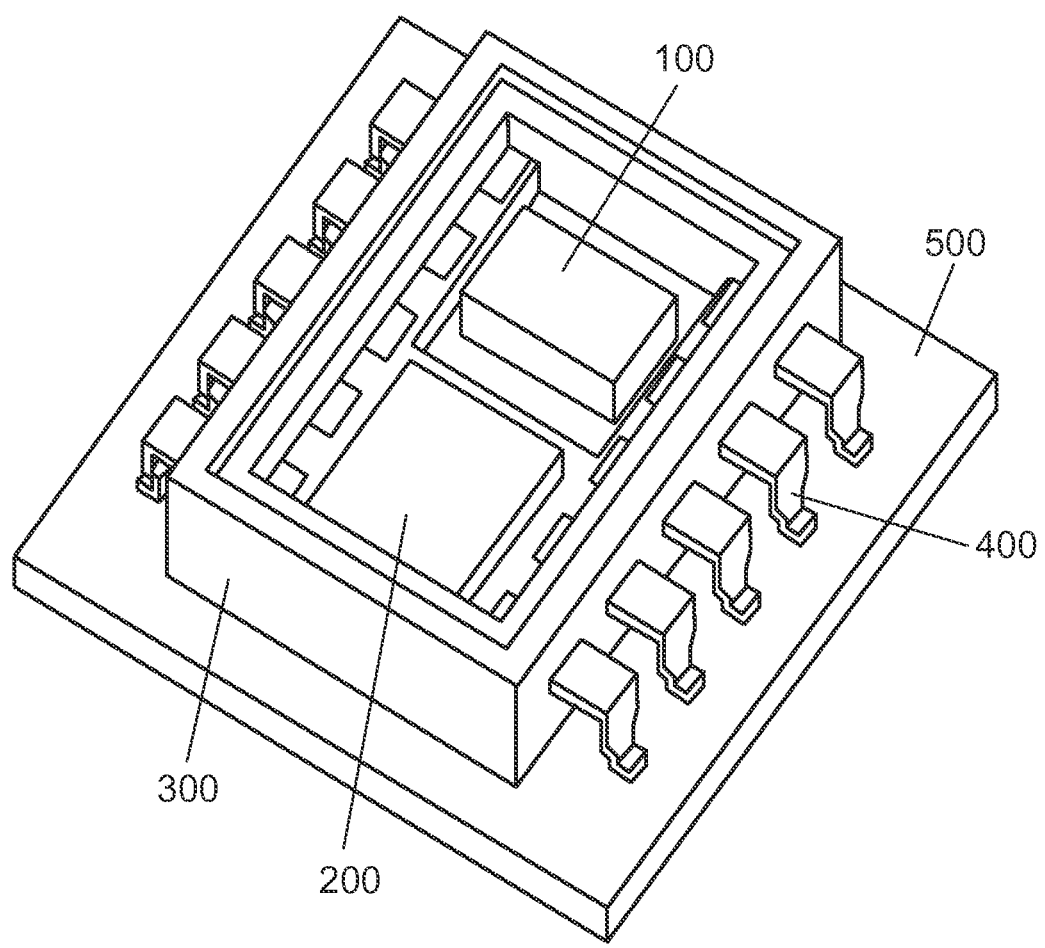
FIG. 1 is a perspective view showing an internal structure of a package incorporating a MEMS device in accordance with an exemplary embodiment.

FIG. 1 is a perspective view showing an internal structure of a package incorporating a MEMS device in accordance with an exemplary embodiment. FIG. 1 shows a state in which a lid of package 300 is opened. Package 300 is mounted on substrate 500. Sensor chip 100 and integrated circuit 200 such as an ASIC (Application Specific Integrated Circuit) are mounted on package 300. The MEMS device is accommodated in sensor chip 100. Integrated circuit 200 carries out various operations based on an output from sensor chip 100. Terminals 400 are extracted from package 300 and connected to substrate 500. Hereinafter, a capacitance type acceleration sensor as a MEMS device is described.

FIG. 2A is a vertical sectional view of acceleration sensor 214 in accordance with the exemplary embodiment. FIG. 2B is a horizontal sectional schematic view of acceleration sensor 214 in accordance with the exemplary embodiment. FIG. 2C is a top view of movable body 1 of acceleration sensor 214 in accordance with the exemplary embodiment.

Figure 2E:
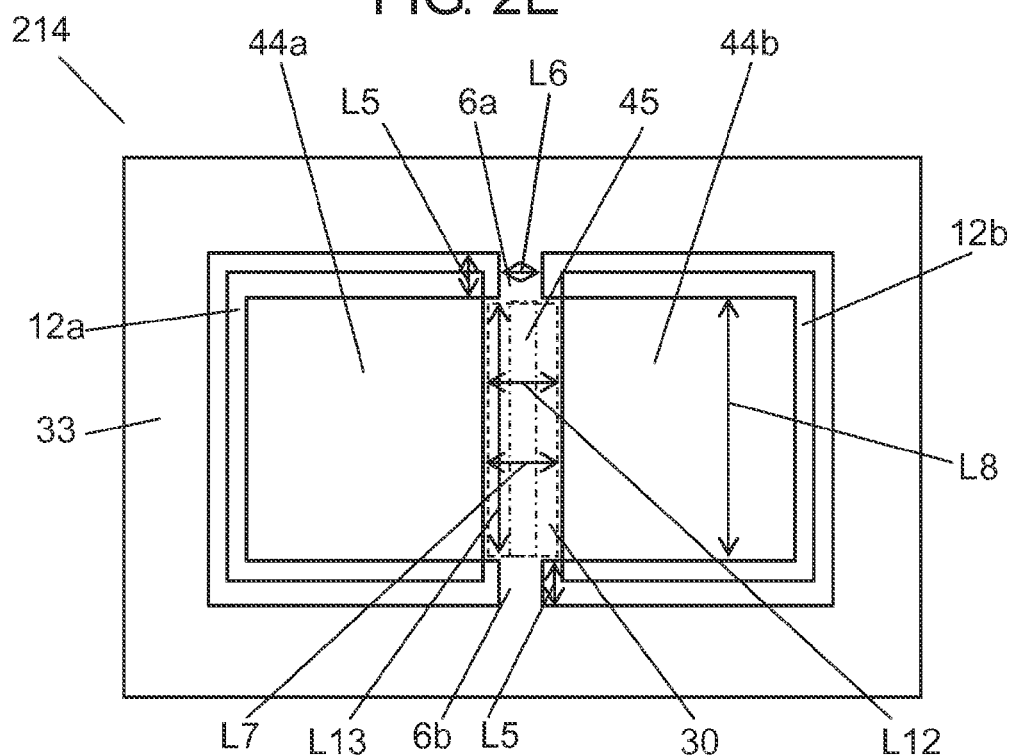
FIG. 2E is a schematic view illustrating a recess of the acceleration sensor in accordance with the exemplary embodiment.

FIG. 2D is a bottom view of movable body 1 of acceleration sensor 214 in accordance with the exemplary embodiment. FIG. 2E is a schematic view illustrating recess 30 of acceleration sensor 214 in accordance with the exemplary embodiment. Note here that in the schematic view, hidden portions are shown by solid lines for description.

The MEMS device includes movable body 1 and electrode substrates 2a and 2b. Movable body 1 includes movable section 11, frame 33, and beams 6a and 6b. Frame 33 is apart from movable section 11 and surrounds a surrounding of movable section 11. It is noted that the movable body 1 is also referred to as a sensor substrate. Beams 6a and 6b extend from two places of frame 33 and are connected to movable section 11.

Frame 33 and beams 6a and 6b are formed of silicon (Si). Movable section 11 is formed of SOI (Silicon on Insulator). Specifically, movable section 11 is formed by sandwiching oxide film 11b between Si layer 11a (first Si layer) and Si layer 11c (second Si layer). Herein, oxide film 11b is, for example, $SiO_2$ or SiO film. Furthermore, beams 6a and 6b are formed of Si layer 11a (first Si layer).

Frame 33 is an outer frame surrounding movable section 11. Movable section 11 is supported by frame 33 around beams 6a and 6b as a rotary shaft.

As shown in FIG. 2C, movable section 11 includes shaft 45 that is an extension portion of beams 6a and 6b, and swing sections 44a (first swing portion) and 44b (second swing portion) that are places other than shaft 45 in movable section 11. Swing section 44a is a cube, and swing section 44b is a cube having opening 11d at an opposite side to a surface facing fixed electrode 12b.

Electrode substrates 2a and 2b are disposed to both surfaces of movable body 1. A periphery (that is, frame 33) of movable body 1 is bonded to peripheries of electrode substrates 2a and 2b by anodic bonding. Electrode substrate 2a includes substrate section 20a, lead electrodes 14a, 14b and 14c, fixed electrodes 12a and 12b, and dummy electrode 12c. Substrate section 20a is formed of glass. Lead electrodes 14a, 14b, and 14c are formed of Si. Electrode substrate 2b includes substrate section 20b formed of glass. Fixed electrodes 12a and 12b are a metal thin film such as an Al—Si film or an Al—Ti film, formed by, for example, sputtering. Fixed electrode 12a (first fixed electrode) is formed on electrode substrate 2a in at least a part of a region facing swing section 44a. Fixed electrode 12b (second fixed electrode) is formed on electrode substrate 2a in at least a part of a region facing swing section 44b. Lead electrodes 14a and 14b are embedded in substrate section 20a, and thereby potential of fixed electrodes 12a and 12b can be respectively led to the upper surface of electrode substrate 2a.

Furthermore, dummy electrode 12c is formed on electrode substrate 2a in at least a part of a region facing shaft 45. Lead electrode 14c is embedded in substrate section 20a, and thereby potential of dummy electrode 12c can be led to the upper surface of electrode substrate 2a.

When movable section 11 swings by acceleration, capacitance between fixed electrode 12a and swing section 44a as well as capacitance between fixed electrode 12b and swing section 44b are changed. For example, capacitance C can be calculated from $C=\in S/d$ where $\in$ is a dielectric constant of a substance, S is an area of electrodes sandwiching the substance, and d is a gap between the electrodes. Since capacitance C is changed when movable section 11 swings by acceleration, the acceleration can be detected by calculating the differential capacity with integrated circuit 200.

That is to say, acceleration sensor 214 detects displacement of movable section 11 from the change in the capacitance between movable section 11 and fixed electrodes 12a and 12b, and then detects acceleration based on the detected displacement.

A plurality of projecting stoppers 34 is formed on movable section 11 at a surface facing fixed electrodes 12a and 12b. Formation of stoppers 34 can suppress damage due to collision of movable section 11 with fixed electrodes 12a and 12b even when large acceleration is applied to movable section 11.

Bonding portions between electrode substrates 2a and 2b and frame 33 are substrate sections 20a and 20b, respectively; and are formed of glass. Bonding portions between frame 33 and electrode substrates 2a and 2b are formed of silicon (Si). Electrode substrates 2a and 2b and movable body 1 are bonded to each other by anodic bonding.

Furthermore, recess 30 is provided to movable section 11 at a region facing a portion (hereinafter, referred to as "facing region") interposed between fixed electrode 12a and fixed electrode 12b. Recess 30 is formed by thinning at least a part of the facing region of movable section 11. By providing recess 30, it is possible to suppress bonding of movable section 11 to substrate section 20a.

As shown in FIGS. 2A and 2E, distance L12 in the lateral direction of recess 30 is 40 µm, distance L13 in the longitudinal direction of recess 30 is 800 µm, and depth L11 of recess 30 is 11 µm. Herein, the distance in the longitudinal direction of the facing region is 1000 µm, and distance L7 in the lateral direction is 40 µm. That is to say, recess 30 is formed by etching to only a depth of 11 µm so as to remove a region having 800×40 µm² in the facing region having an area of 1000×40 µm². By providing recess 30, it is possible to suppress bonding of movable section 11 to substrate section 20a.

Furthermore, for example, distance L7 between fixed electrodes 12a and 12b is 40 µm, width L8 of movable section 11 is 1000 µm, distance L3 between substrate section 20a and movable section 11 is 2.2 µm, and thicknesses L4 of each of fixed electrodes 12a and 12b is 0.2 µm. In this case, when movable body 1 and electrode substrate 2a are bonded to each other by anodic bonding at a voltage of 600 V, an electrostatic attraction force of about 16 mN is generated in movable section 11.

Furthermore, width L6 of each of beams 6a and 6b is 12 µm, thickness L2 is 11 µm, length L5 is 150 µm, and height L1 of stopper 34 formed on movable section 11 is 1.1 µm. In this case, an elastic force is 3.6 mN when movable section 11 is attracted by 0.9 µm. In this case, since the electrostatic attraction force is larger than the elastic force, movable section 11 may be bonded to substrate section 20a. However, by providing recess 30, the electrostatic attraction force can be reduced to 3.5 mN. That is to say, when the electrostatic attraction force is made to be smaller than an elastic force, it is possible to suppress bonding of movable section 11 to substrate section 20a.

In acceleration sensor 214, electrode substrate 2a includes dummy electrode 12c in the region facing shaft 45. Dummy electrode 12c is electrically floating. Dummy electrode 12c is a metal thin film such as an Al—Si film or an Al—Ti film, and can be formed by the same process as that for fixed electrodes 12a and 12b. Dummy electrode 12c is connected to one end of lead electrode 14c.

It is desirable that width L21 of dummy electrode 12c be somewhat larger than width L6 of each of beams 6a and 6b. For example, when width L6 of each of beams 6a and 6b is 12 µm, width L21 of dummy electrode 12c is preferably 20 m or more. With such a configuration, the electrostatic attraction force generated during anodic bonding can be further reduced.

Figure 2F:
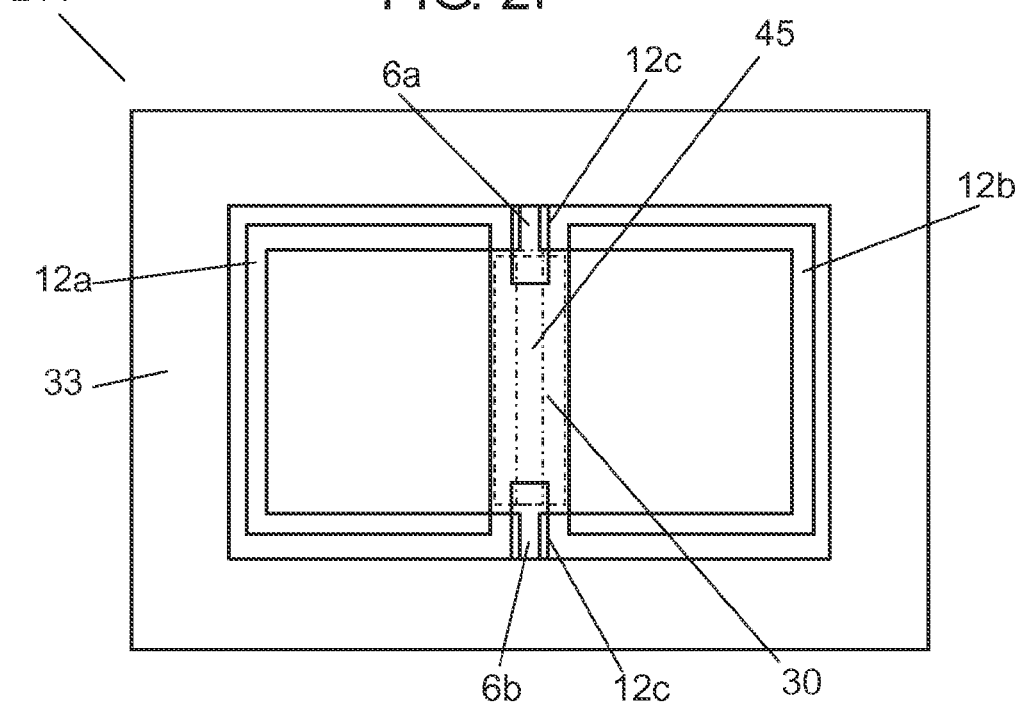
FIG. 2F is a schematic view illustrating a dummy electrode of another acceleration sensor in accordance with the exemplary embodiment.

Note here that in FIG. 2E, dummy electrode 12c is formed along a region facing recess 30. However, the exemplary embodiment is not limited to this configuration. As shown in FIG. 2F, dummy electrode 12c may be formed on electrode substrate 2a in at least a part of the region facing shaft 45.

However, even when recess 30 is formed, when anodic bonding is carried out, an electrostatic attraction force of 3.5 mN is generated in movable section 11. Therefore, it is desirable that dummy electrode 12c be formed not only in the region facing shaft 45 but also in the region facing recess 30.

Figure 3A:
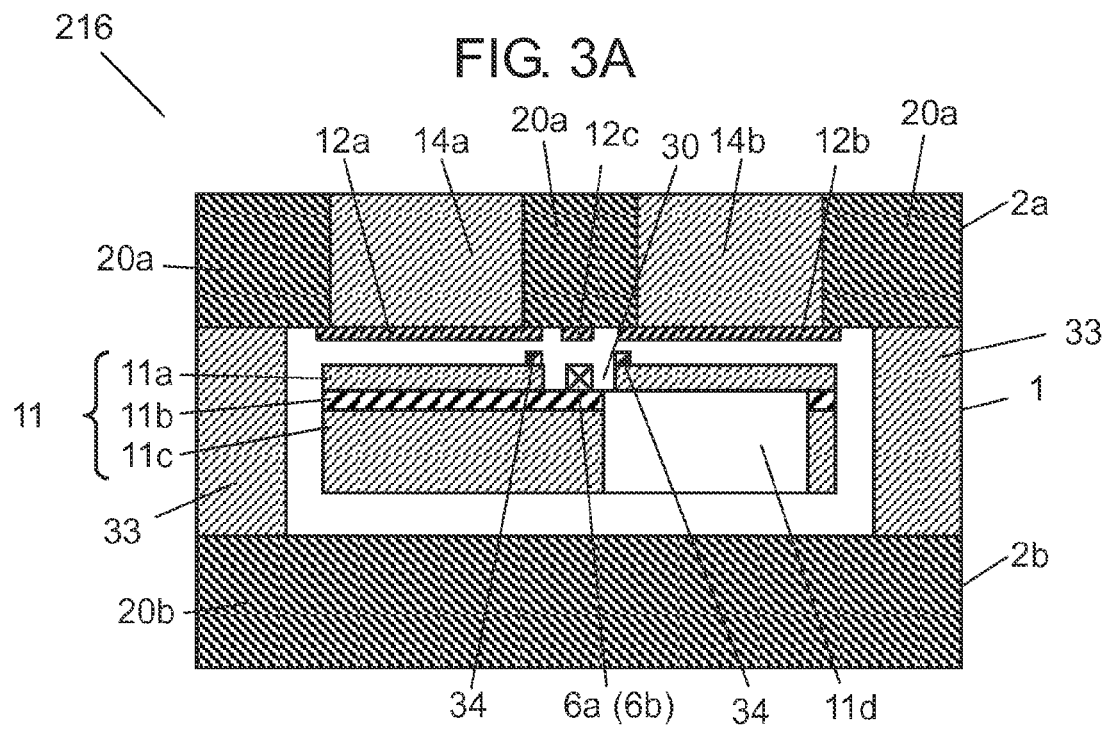
FIG. 3A is a vertical sectional view of a still another acceleration sensor in accordance with the exemplary embodiment.
Figure 3B:
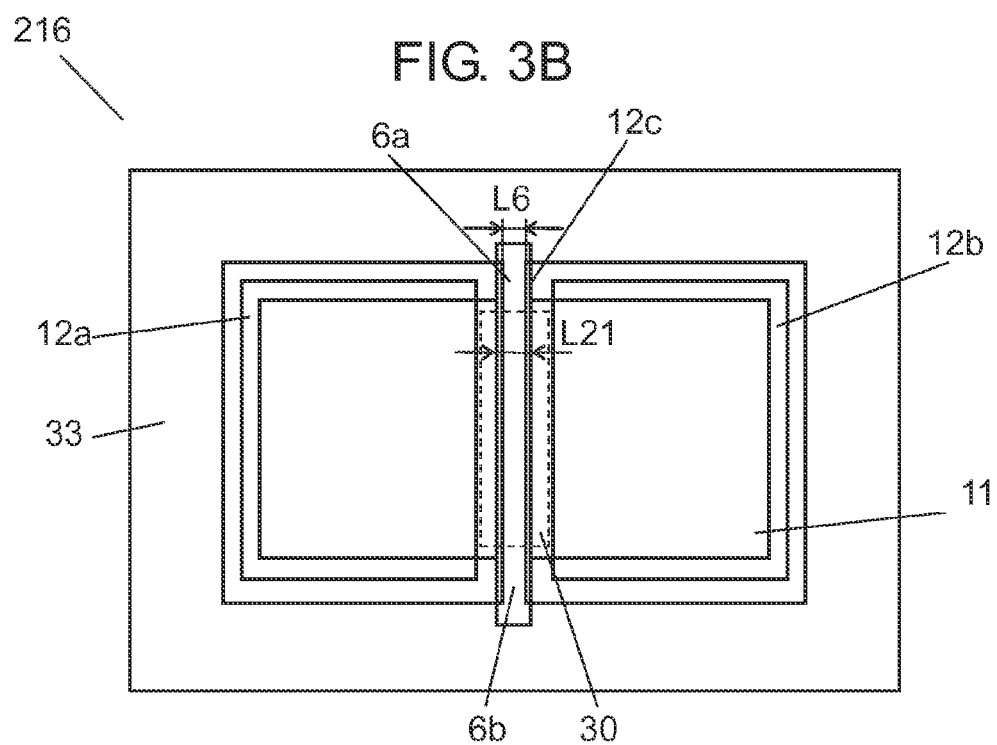
FIG. 3B is a horizontal sectional schematic view of the still another acceleration sensor in accordance with the exemplary embodiment.

FIG. 3A is a vertical sectional view of acceleration sensor 216 in accordance with the exemplary embodiment. FIG. 3B is a horizontal sectional schematic view of acceleration sensor 216 in accordance with the exemplary embodiment. Acceleration sensor 216 is different from acceleration sensor 214 in that lead electrode 14c is not formed and dummy electrode 12c is connected to common potential. Note here that in the schematic view, hidden portions are shown by solid lines for description.

Specifically, dummy electrode 12c is connected to frame 33 formed of Si. That is to say, dummy electrode 12c and movable section 11 have the same potential. With this configuration, even when an unnecessary signal is applied from the outside, the upper parts of beams 6a and 6b are not electrically charged to a potential other than the common potential. Therefore, beams 6a and 6b are not easily brought into contact with electrode substrate 2a. That is to say, by connecting dummy electrode 12c to common potential, since the electrostatic attraction force generated during anodic bonding can be further reduced, acceleration sensor 216 resistant to disturbance can be obtained.

Figure 4A:
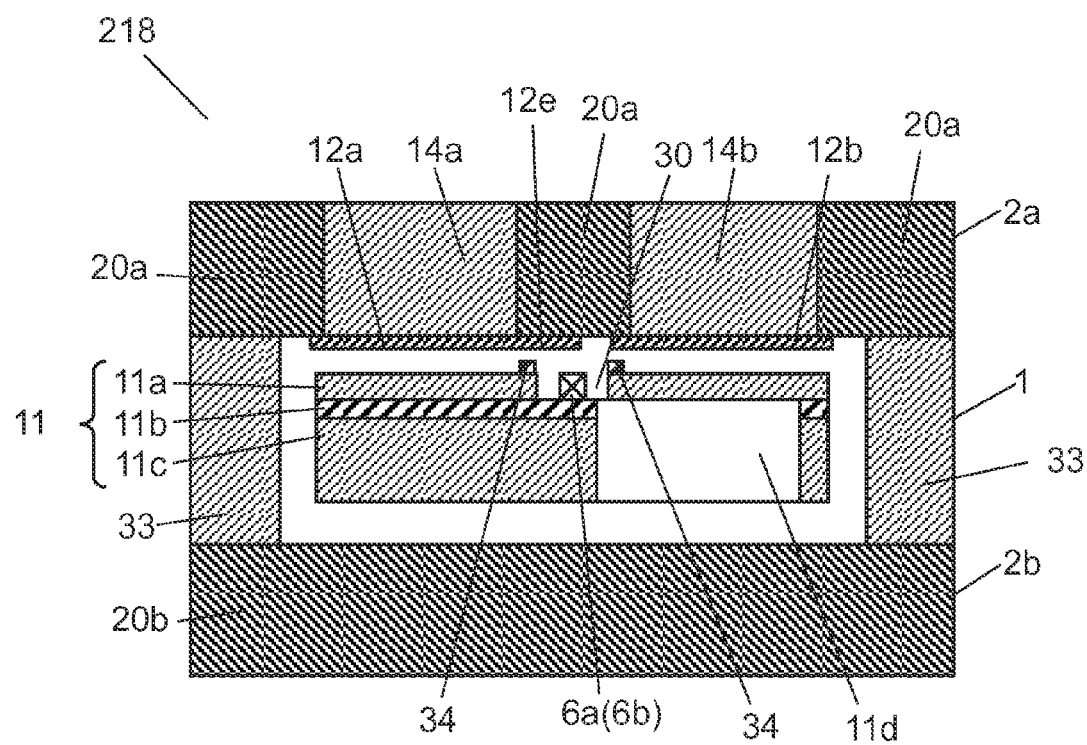
FIG. 4A is a vertical sectional view of a yet another acceleration sensor in accordance with the exemplary embodiment.
Figure 4B:
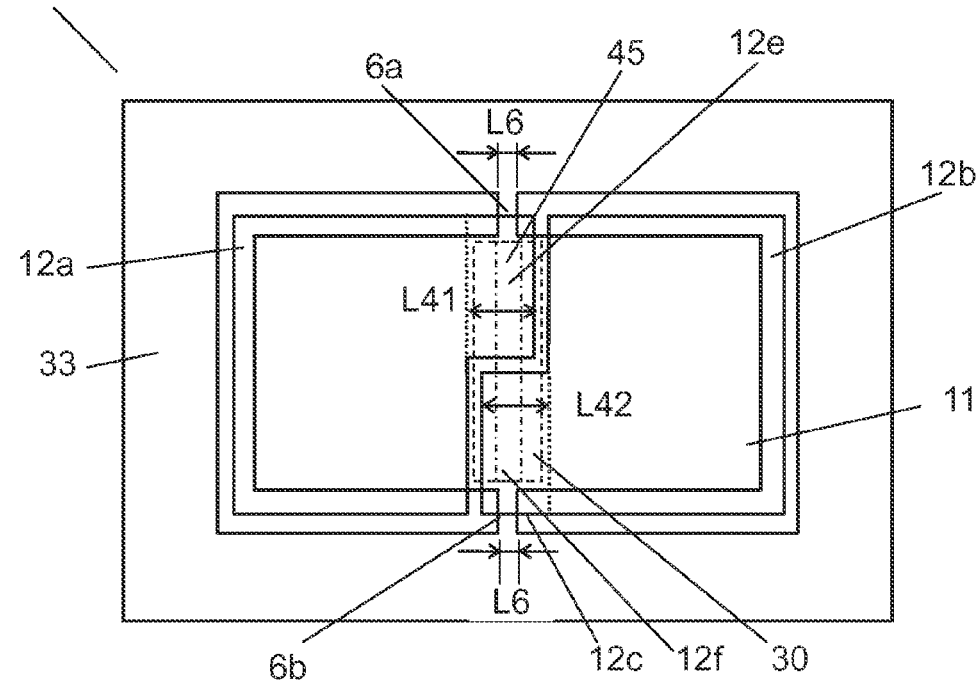
FIG. 4B is a horizontal sectional schematic view of the yet another acceleration sensor in accordance with the exemplary embodiment.

FIG. 4A is a vertical sectional view of acceleration sensor 218 in accordance with the exemplary embodiment. FIG. 4B is a horizontal sectional schematic view of acceleration sensor 218 in accordance with the exemplary embodiment. FIG. 4C is a bottom schematic view of fixed electrodes 12a and 12b and extended electrodes 12e and 12f of acceleration sensor 218 in accordance with the exemplary embodiment. Acceleration sensor 218 is different from acceleration sensor 214 in that dummy electrode 12c and lead electrode 14c are not formed, and that at least one of fixed electrodes 12a and 12b protrudes to the region facing shaft 45. Note here that in the schematic view, hidden portions are shown by solid lines for description.

Specifically, a part of fixed electrode 12a (first fixed electrode) protrudes toward fixed electrode 12b so as to form an electrode on electrode substrate 2a also in the region facing shaft 45. The protruding rectangular electrode is defined as extended electrode 12e (first extended electrode). Furthermore, a part of fixed electrode 12b (second fixed electrode) protrudes toward fixed electrode 12a so as to form an electrode on electrode substrate 2a also in the region facing shaft 45. The protruding rectangular electrode is defined as extended electrode 12f (second extended electrode). Extended electrodes 12e and 12f can be formed unitarily with fixed electrodes 12a and 12b, respectively. Material of extended electrodes 12e and 12f is a metal thin film such as an Al—Si film or an Al—Ti film similar to that of fixed electrodes 12a and 12b. For example, when width L6 of each of beams 6a and 6b is 12 μm, width L41 of extended electrode 12e and width L42 of extended electrode 12f are preferably 40 μm or more, respectively. With this configuration, the upper parts of beams 6a and 6b are not easily electrically charged.

Note here that in FIG. 4B, extended electrode 12e is formed on electrode substrate 2a in a large part of the region facing recess 30, but the exemplary embodiment is not necessarily limited to this configuration. FIG. 4D is a horizontal sectional schematic view of acceleration sensor 219 in accordance with the exemplary embodiment. In FIG. 4D, hidden portions are shown by solid lines for description. As shown in FIG. 4D, extended electrode 12e may be formed in at least a part of the region facing shaft 45. Furthermore, recess 30 may not be provided. However, when recess 30 is provided, an electrostatic attraction force can be reduced. Even when recess 30 is provided, since an electrostatic attraction force of 3.5 mN is generated in movable section 11 when anodic bonding is carried out. Therefore, it is preferable that extended electrodes 12e and 12f are formed not only in a part of the region facing shaft 45, but also in a large part of the region facing recess 30.

Figure 4E:
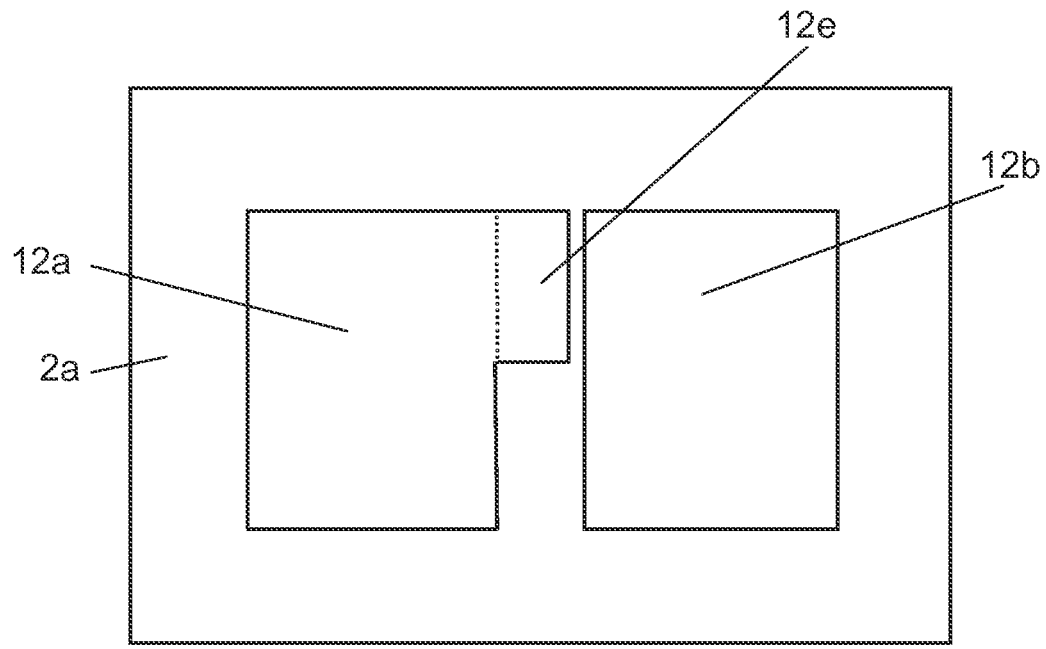
FIG. 4E is a bottom schematic view of a fixed electrode and an extended electrode of the further acceleration sensor in accordance with the exemplary embodiment.
Figure 4F:
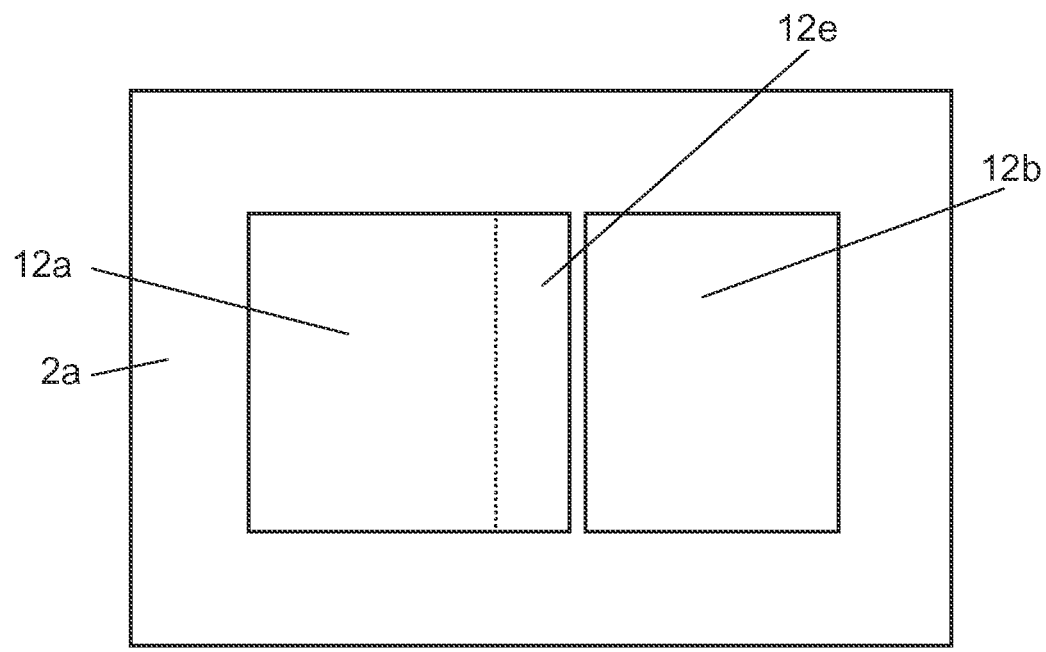
FIG. 4F is a bottom schematic view of a fixed electrode and an extended electrode of a still further acceleration sensor in accordance with the exemplary embodiment.

Furthermore, in the exemplary embodiment, as shown in FIG. 4C, extended electrode 12e and extended electrode 12f are formed point-symmetrically. However, the embodiments of extended electrodes 12e and 12f are not limited to this alone. For example, as shown in FIGS. 4E and 4F, only extended electrode 12e may be formed. Only extended electrode 12f may be formed. Furthermore, a shape of extended electrode 12e may be different from that of extended electrode 12f. Note here that in the exemplary embodiment, the shapes of extended electrodes 12e and 12f are rectangular, but the shapes may be circular, polygonal, or the like.

According to the exemplary embodiment, an electrostatic attraction force generated in anodic bonding is reduced, and the upper parts of beams 6a and 6b are not easily electrically charged. Accordingly, even when an unnecessary signal is applied from the outside, beams 6a and 6b are not easily brought into contact with electrode substrate 2a. Therefore, acceleration sensors 218 and 219 resistant to disturbance can be obtained.

Furthermore, in acceleration sensors 214 and 216, since dummy electrode 12c is provided separately from the fixed electrodes, areas of fixed electrodes 12a and 12b are reduced by an area of dummy electrode 12c. Since dummy electrode 12c does not contribute to detection of acceleration, the reduction of fixed electrodes 12a and 12b may deteriorate the detection sensitivity. However, acceleration sensors 218 and 219 do not include dummy electrode 12c. Therefore, the electrostatic attraction force generated during anodic bonding can be reduced without deteriorating detection sensitivity.

Note here that in the exemplary embodiment, recess 30 is formed, but recess 30 may not be formed. However, since the electrostatic attraction force can be reduced when recess 30 is formed, recess 30 is preferably formed.

Furthermore, in the exemplary embodiment, beams 6a and 6b are provided in two portions, but the beam may be provided in one place.

Next, a maximum deflection amount of beams 6a and 6b by an electrostatic attraction force generated during anodic bonding is described with reference to FIGS. 5A, 5B, 5C, and 6.

Figure 5A:
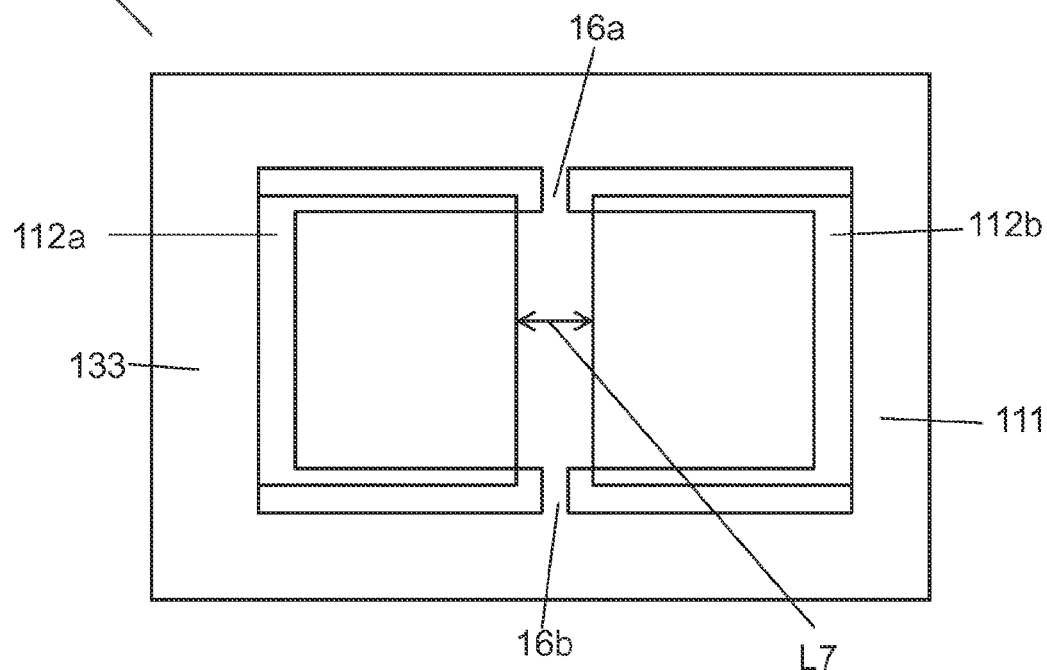
FIG. 5A is a schematic view illustrating a configuration of a movable section and fixed electrodes of a conventional acceleration sensor.
Figure 5B:
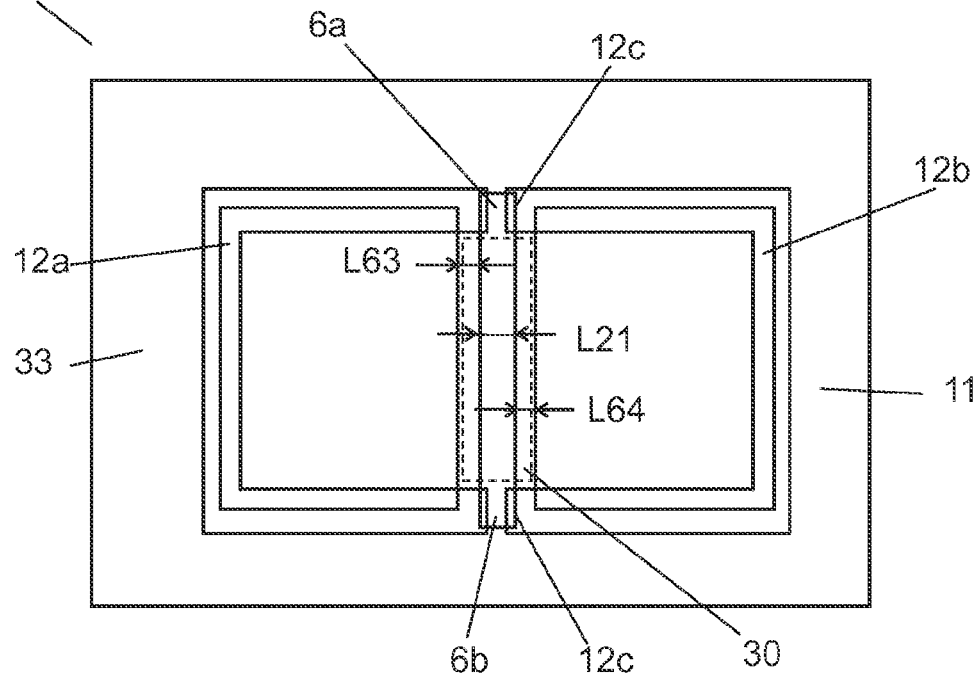
FIG. 5B is a schematic view illustrating a configuration of a movable section, fixed electrodes, and a dummy electrode of the acceleration sensor in accordance with the exemplary embodiment.

FIG. 5A is a schematic view illustrating a configuration of movable section 111 and fixed electrodes 112a and 112b of conventional acceleration sensor 210. FIG. 5B is a schematic view illustrating a configuration of movable section 11, fixed electrodes 12a and 12b, and dummy electrode 12c of acceleration sensor 214 in accordance with the exemplary embodiment. FIG. 5C is a schematic view illustrating a configuration of movable section 11, fixed electrodes 12a and 12b, and extended electrodes 12e and 12f of acceleration sensor 218 in accordance with the exemplary embodiment. FIG. 5A shows a schematic view of acceleration sensor 210 in the horizontal sectional direction. FIG. 5B shows a schematic view of acceleration sensor 214 in the horizontal sectional direction. FIG. 5C shows a schematic view of acceleration sensor 218 in the horizontal sectional direction. Acceleration sensor 210 shown in FIG. 5A is defined as sample A, acceleration sensor 214 shown in FIG. 5B is defined as sample B, and acceleration sensor 218 shown in FIG. 5C is defined as sample C. Note here that in the schematic view, hidden portions are shown by solid lines for description.

In sample A, as shown in FIG. 5A, distance L7 between fixed electrodes 112a and 112b is 40 µm. In sample B, as shown in FIG. 5B, width L21 of dummy electrode 12c is 20 µm. Distance L63 from fixed electrode 12a to dummy electrode 12c is 20 µm, and distance L64 from fixed electrode 12b to dummy electrode 12c is 20 µm. In sample C, as shown in FIG. 5C, the largest distance L73 between fixed electrodes 12a and 12b is 60 µm. Furthermore, width L41 of extended electrode 12e and width L42 of extended electrode 12f are 40 µm, respectively. That is to say, the narrowest distance L75 between fixed electrodes 12a and 12b is 20 µm. In the exemplary embodiment, the distance is that in the horizontal cross section.

Figure 6:
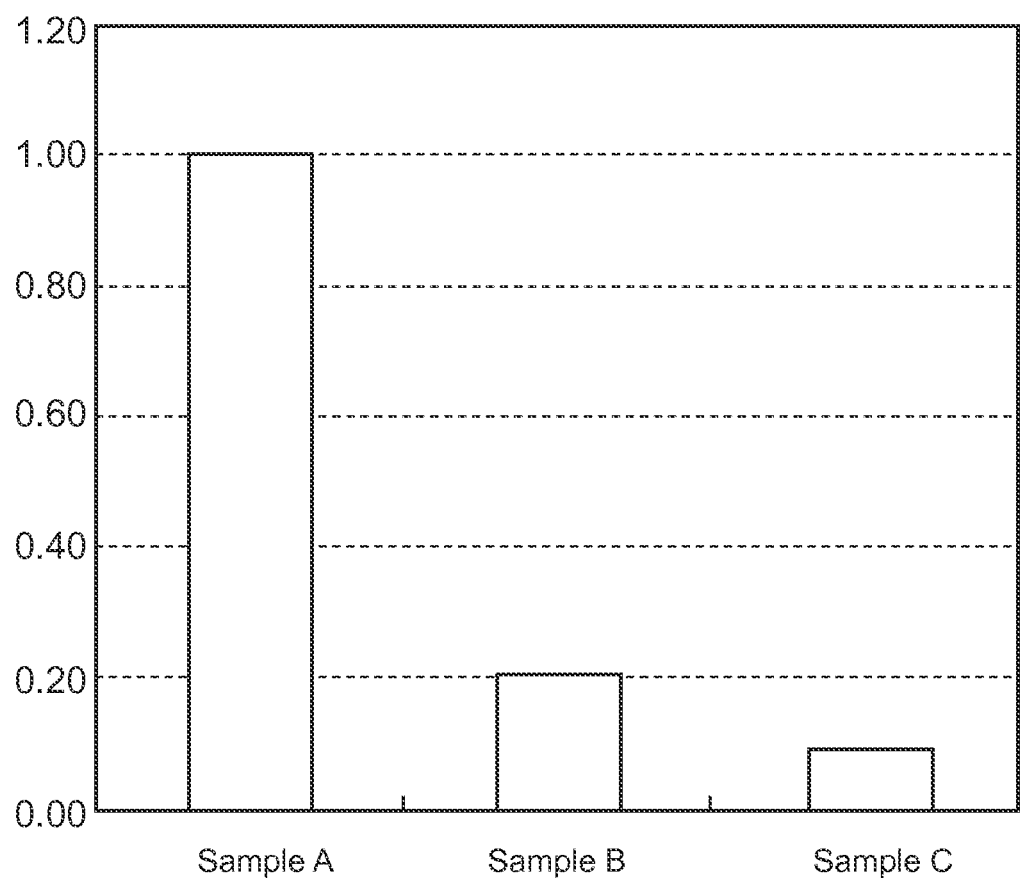
FIG. 6 is a graph showing a maximum deflection amount of a beam portion of the acceleration sensor.
Figure 7:
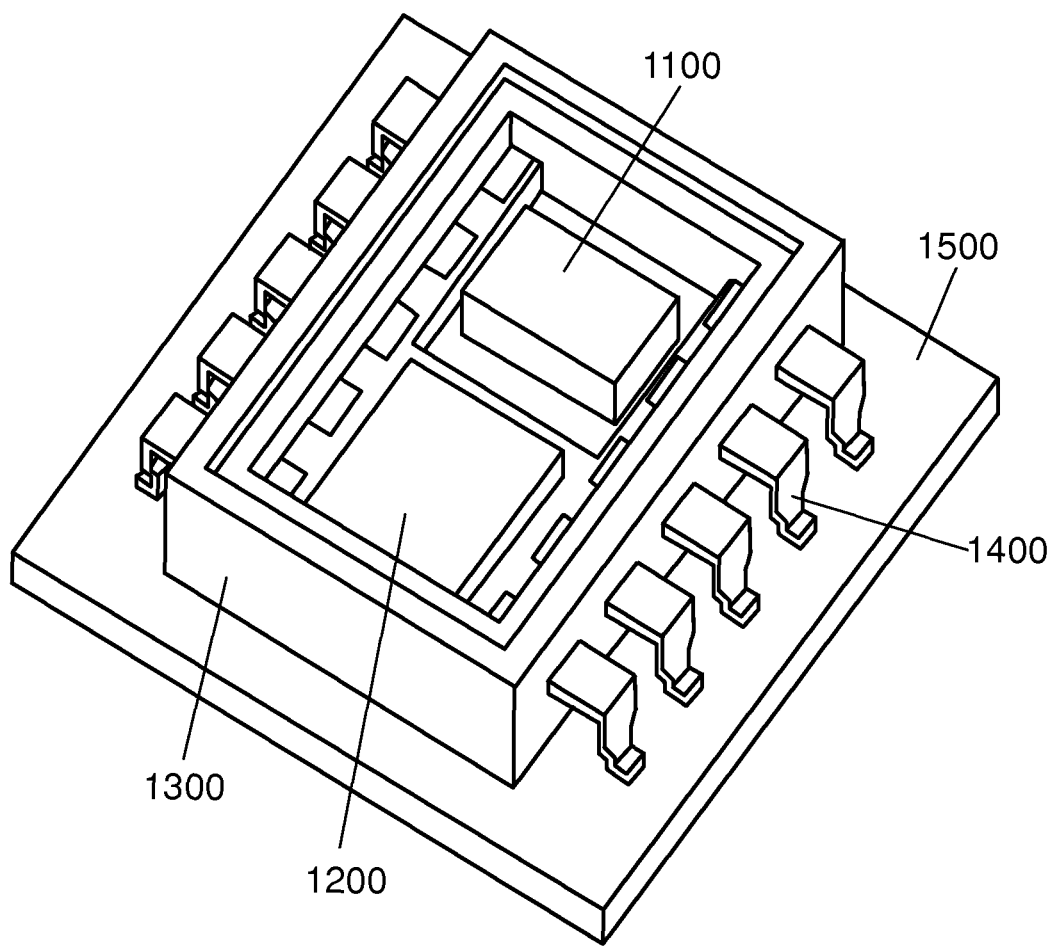
FIG. 7 is a perspective view showing an internal structure of a package incorporating a conventional MEMS device.
Figure 8A:
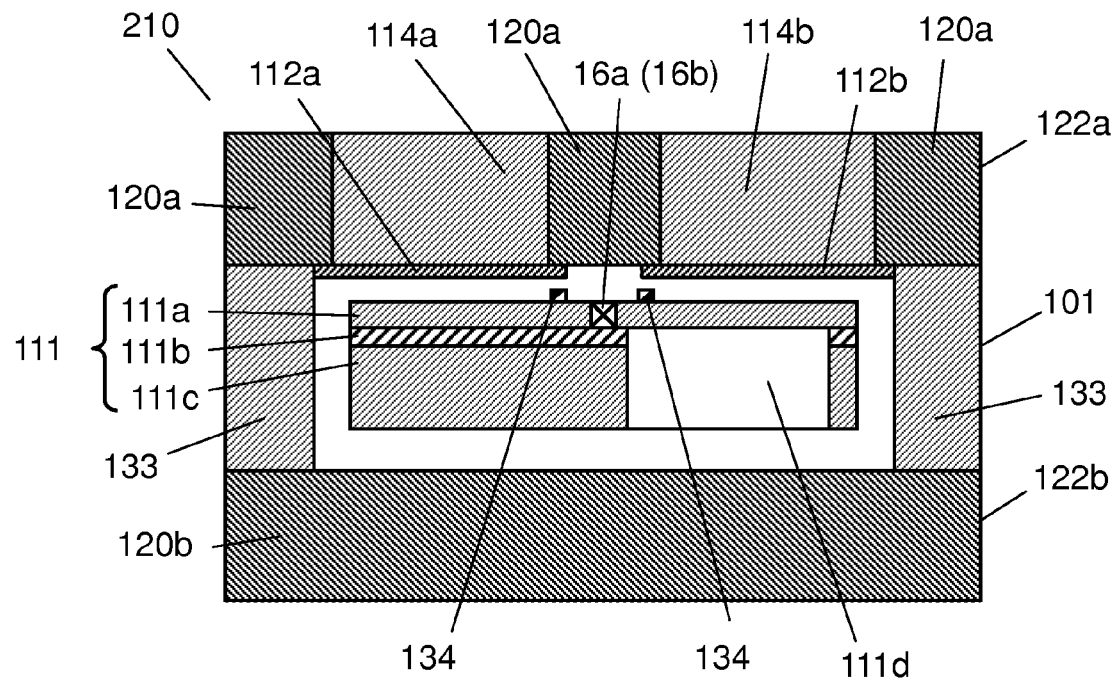
FIG. 8A is a vertical sectional view of a conventional acceleration sensor.
Figure 8B:
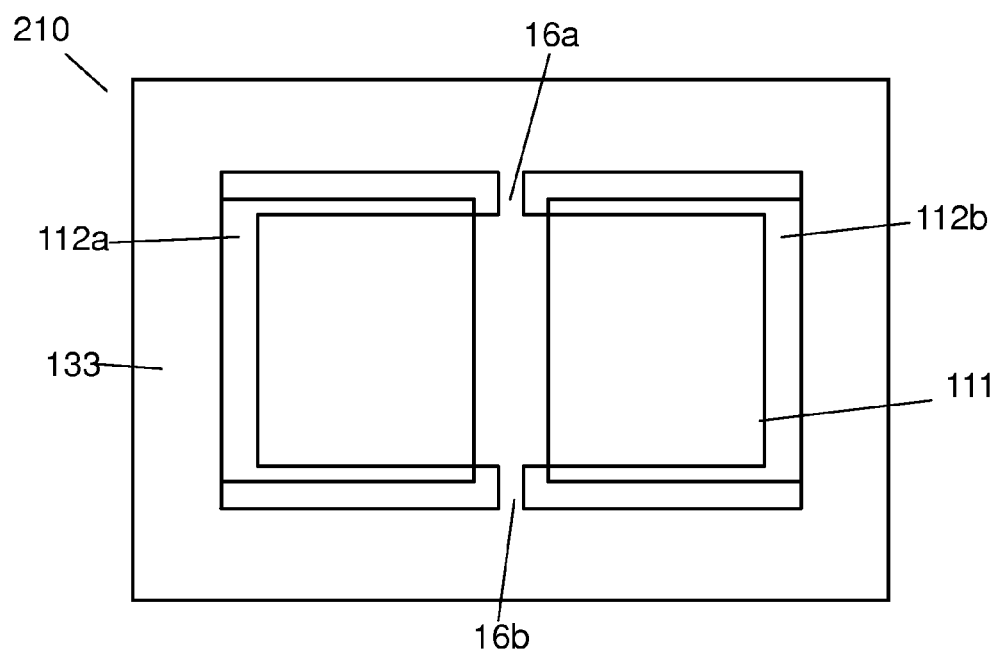
FIG. 8B is horizontal sectional schematic view of the conventional acceleration sensor.
Figure 8C:
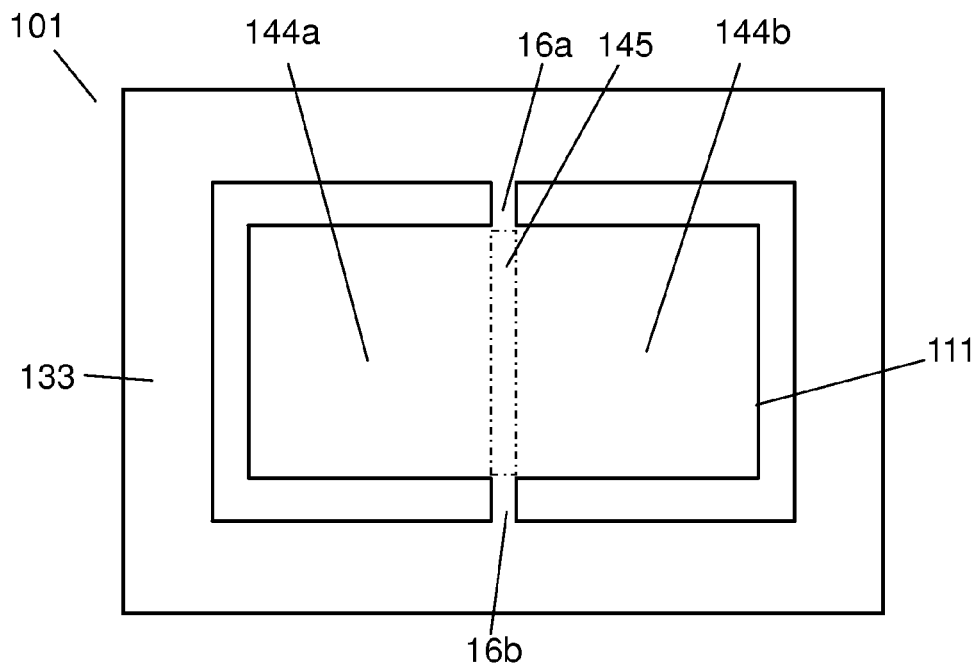
FIG. 8C is a top view of a movable body of the conventional acceleration sensor.
Figure 8D:
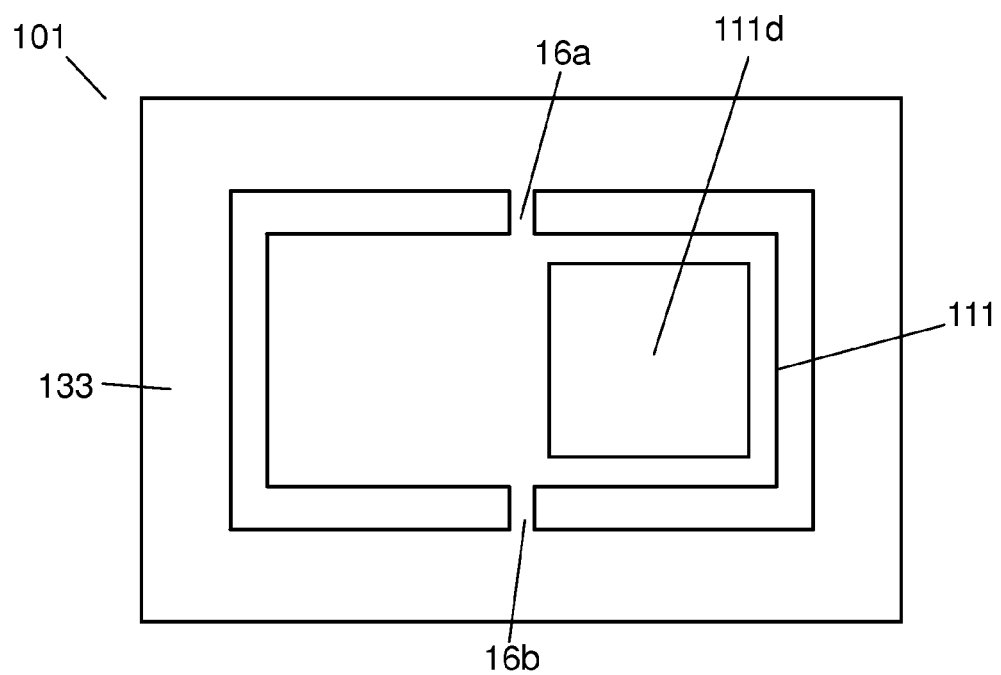
FIG. 8D is a bottom view of a movable body of the conventional acceleration sensor.
Figure 9A:
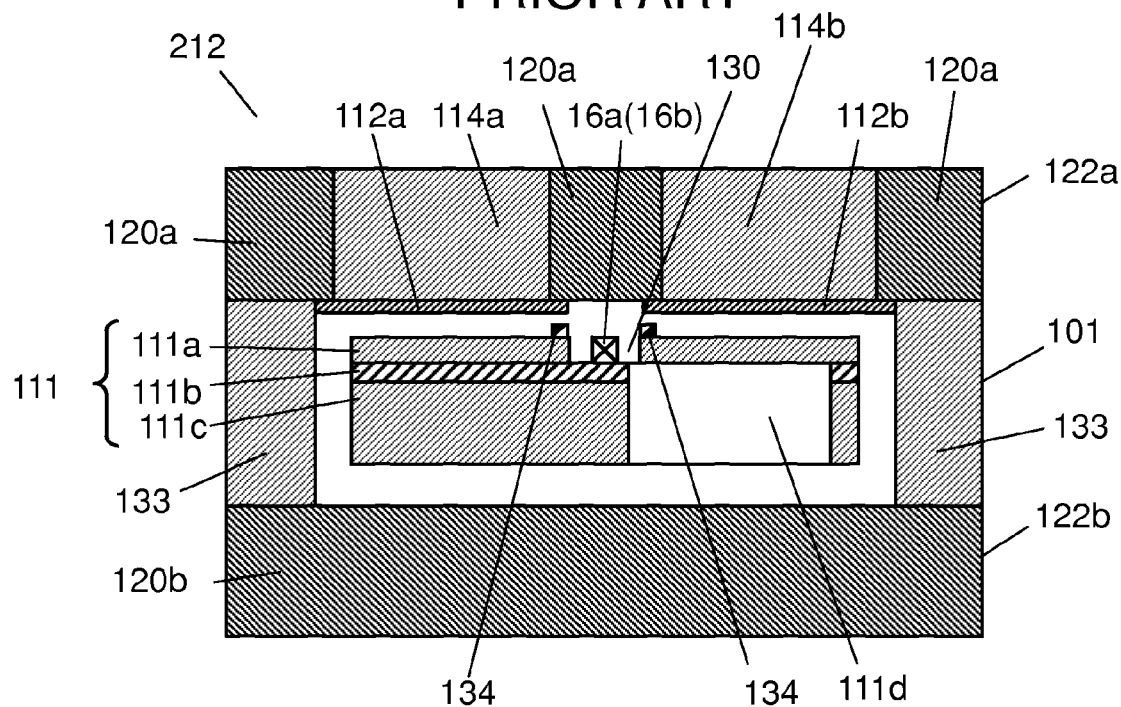
FIG. 9A is a sectional view of another conventional acceleration sensor.
Figure 9B:
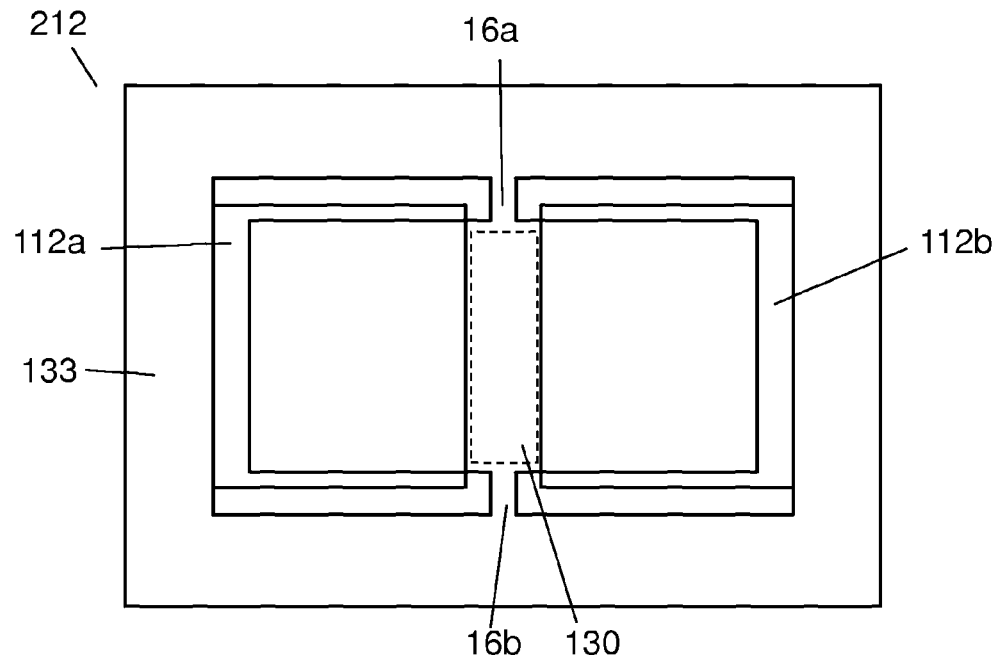
FIG. 9B is a horizontal sectional schematic view of the another conventional acceleration sensor.

FIG. 6 is a graph showing a maximum deflection amount of the beam portion of the acceleration sensor. The maximum deflection amount in beam portions 16a and 16b of sample A is defined as "1," respectively.

As shown in FIG. 6, when the maximum deflection amount in sample A is defined as "1," the maximum deflection amount of sample B is about 0.20, and the maximum deflection amount of sample C is about 0.10. In this way, formation of dummy electrode 12c can suppress the deflection in beams 6a and 6b. In addition, formation of extended electrodes 12e and 12f can further suppress the deflection of beams 6a and 6b.

Note here that in acceleration sensor 216 shown in FIGS. 3A and 3B, when width L21 of dummy electrode 12c is 20 µm, the width from fixed electrode 12a to dummy electrode 12c is 20 µm, and the width from fixed electrode 12b to dummy electrode 12c is 20 µm, the configuration is substantially the same as that in sample B. Therefore, the maximum deflection amount in that case is about 0.2.

Note here that in FIG. 4A, a fixed electrode (not shown) may be further provided on electrode substrate 12b and an alternating voltage may be applied between movable section 11 and fixed electrode 12b so as to allow electrostatic attraction to act between movable section 11 and fixed electrode 12b, thus vibrating movable section 11 in the vertical direction.

Note here that the exemplary embodiment is not necessarily limited to the above-mentioned examples, and various modifications are possible. For example, in the exemplary embodiment, electrode substrate 2a is provided with two fixed electrodes 12a and 12b, but the number of the fixed electrodes is not limited to two. Furthermore, the shape, length and layout of dummy electrode 12c can be appropriately varied.

INDUSTRIAL APPLICABILITY

A MEMS device of this exemplary embodiment is useful for a capacitance type acceleration sensor, because beams are not easily bonded to glass when a movable body and an electrode substrate are bonded to each other by anodic bonding.

The invention claimed is:

1. A MEMS device comprising:
a sensor substrate including a movable section, a beam connected to the movable section, and a frame connected to the beam; and
a substrate including a fixed electrode and an extended electrode, and disposed on the sensor substrate,
wherein the fixed electrode is formed on the substrate in at least a part of a region facing the movable section, and
the extended electrode is connected to the fixed electrode, and formed on the substrate in at least a part of a region facing the beam.

2. The MEMS device of claim 1, wherein
the movable section includes a first portion and a second portion with the beam interposed therebetween,
the fixed electrode includes a first fixed electrode and a second fixed electrode;
the extended electrode includes a first extended electrode and a second extended electrode;
the first fixed electrode is formed in at least a part of a region facing the first portion;
the second fixed electrode is formed in at least a part of a region facing the second portion;
the first extended electrode is connected to the first fixed electrode, and formed on the substrate in at least a part of a region facing the beam, and
the second extended electrode is connected to the second fixed electrode, and formed on the substrate in at least a part of the region facing the beam.

3. The MEMS device of claim 2, wherein the first extended electrode and the second extended electrode are formed point-symmetrically.

4. The MEMS device of claim 2, wherein the first extended electrode and the second extended electrode have a rectangular shape.

5. The MEMS device of claim 2, wherein the movable section includes a recess in at least a part of a region facing a portion interposed between the first fixed electrode and the second fixed electrode.

6. The MEMS device of claim 2, wherein the second portion has an opening at an opposite side to a surface facing the second fixed electrode.

7. The MEMS device of claim 1, wherein the movable section is formed of SOI (Silicon on Insulator).

8. The MEMS device of claim 7, wherein the SOI includes a first Si layer, a second Si layer, and an oxide film between the first Si layer and the second Si layer.

9. The MEMS device of claim 8, wherein the beam is formed of the first Si layer.

10. The MEMS device of claim 1, wherein the frame is formed of Si, and the substrate is formed of glass.

11. The MEMS device of claim 10, wherein the frame and the substrate are bonded to each other by anodic bonding.

12. The MEMS device of claim 1, wherein the fixed electrode is formed of a metal thin film, and connected to a lead electrode formed of Si in the substrate.

\* \* \* \* \*